United States Patent
Jiang et al.

(10) Patent No.: US 12,328,973 B2
(45) Date of Patent: *Jun. 10, 2025

(54) MULTI-QUANTUM WELL STRUCTURE AND LED DEVICE INCLUDING THE SAME

(71) Applicant: XIAMEN SAN'AN OPTOELECTRONICS CO., LTD., Xiamen (CN)

(72) Inventors: Han Jiang, Wuhu (CN); Yung-Ling Lan, Wuhu (CN); Wen-Pin Huang, Wuhu (CN); Changwei Song, Wuhu (CN); Li-Cheng Huang, Wuhu (CN); Feilin Xun, Xiamen (CN); Chan-Chan Ling, Wuhu (CN); Chi-Ming Tsai, Wuhu (CN); Chia-Hung Chang, Wuhu (CN)

(73) Assignee: XIAMEN SAN'AN OPTOELECTRONICS CO., LTD., Fujian (CN)

( * ) Notice: Subject to any disclaimer, the term of this patent is extended or adjusted under 35 U.S.C. 154(b) by 806 days.

This patent is subject to a terminal disclaimer.

(21) Appl. No.: 17/528,533

(22) Filed: Nov. 17, 2021

(65) Prior Publication Data

US 2022/0077347 A1    Mar. 10, 2022

Related U.S. Application Data

(63) Continuation-in-part of application No. 16/655,832, filed on Oct. 17, 2019, now Pat. No. 11,189,751, which is a continuation-in-part of application No. PCT/CN2018/078655, filed on Mar. 12, 2018.

(30) Foreign Application Priority Data

Apr. 18, 2017 (CN) .......................... 201710252090.7

(51) Int. Cl.
*H01L 33/00* (2010.01)
*H10H 20/812* (2025.01)
*H10H 20/825* (2025.01)
*H10H 20/816* (2025.01)

(52) U.S. Cl.
CPC ........ *H10H 20/812* (2025.01); *H10H 20/825* (2025.01); *H10H 20/8162* (2025.01)

(58) Field of Classification Search
None
See application file for complete search history.

(56) References Cited

U.S. PATENT DOCUMENTS 11,189,751 B2 * 11/2021 Jiang .................... H01L 33/0075
2011/0140079 A1 * 6/2011 Jang ........................ B82Y 20/00
257/13

* cited by examiner

*Primary Examiner* — Bradley Smith
(74) *Attorney, Agent, or Firm* — MUNCY, GEISSLER, OLDS & LOWE, P.C.

(57) ABSTRACT

Disclosed is a multi-quantum well structure including a stress relief layer, an electron-collecting layer disposed on the stress relief layer, and an active layer including a first active layer unit that is disposed on the electron-collecting layer. The first active layer unit includes potential barrier sub-layers and potential well sub-layers being alternately stacked, in which at least one of the potential barrier sub-layers has a GaN/Al$_{x1}$In$_{y1}$Ga$_{(1-x1-y1)}$N stack, where $0<x1\leq 1$ and $0\leq y1<1$. An LED device including the multi-quantum well structure is also disclosed.

18 Claims, 3 Drawing Sheets

MULTI-QUANTUM WELL STRUCTURE AND LED DEVICE INCLUDING THE SAME

CROSS-REFERENCE TO RELATED APPLICATION

This application is a continuation-in-part (CIP) application of U.S. patent application Ser. No. 16/655,832, filed on Oct. 17, 2019, which is a bypass CIP of International Application No. PCT/CN2018/078655, entitled "MULTI-QUANTUM WELL STRUCTURE AND LIGHT-EMITTING DIODE THEREOF," filed on Mar. 12, 2018, which claims priority of Chinese Invention Patent Application No. 201710252090.7, filed on Apr. 18, 2017.

FIELD

This disclosure relates to a multi-quantum well structure, and an LED device including the multi-quantum well structure.

BACKGROUND

As the light-emitting diode (LED) industry gradually develops, an increasing need for developing white LED devices with high luminance and a tolerance toward high current density is observed. Meanwhile, miniaturization of the LED devices under the premise of maintaining their properties (especially luminance) is highly desirable in order to increase the market competitiveness of the LED devices. This trend further elevates the need for tolerance toward high current density in an epitaxial structure of the LED devices, with the efficiency droop effect remaining as one of the biggest problems to be solved.

Conventional epitaxial designs for increasing the tolerance toward high current density and for reducing the efficiency droop effect in an LED device are usually implemented by modifying the structure and composition of an electron-blocking layer disposed on an active layer. Such conventional epitaxial designs may include, for example, gradually changing an Al content in an AlGaN electron-blocking layer, or forming the electron-blocking layer with a superlattice structure such as an AlGaN/GaN superlattice structure, an AlN/GaN superlattice structure, and an AlN/AlGaN superlattice structure. However, such epitaxial designs may not alleviate the energy-band distortion in the active layer of the LED device. Further, a modification in structure and composition may increase the thickness of the electron-blocking layer, which results in a loss of light-emitting efficiency. In addition, a thick electron-blocking layer with a relatively high Al composition may further enlarge openings of V-pit defects in the LED device, which results in a thicker P-type cladding layer being needed to fill and flatten an epitaxial layer of the LED device in order to prevent electrostatic discharge and a loss of infrared functionalities.

SUMMARY

Therefore, a first object of the disclosure is to provide a multi-quantum well structure that can alleviate or eliminate at least one of the drawbacks of the prior art. A second object of the disclosure is to provide a light-emitting diode (LED) device including the multi-quantum well structure.

According to a first aspect of the disclosure, a multi-quantum well structure includes a stress relief layer, an electron-collecting layer disposed on the stress relief layer, and an active layer including a first active layer unit that is disposed on the electron-collecting layer. The first active layer unit includes a plurality of potential barrier sub-layers and a plurality of potential well sub-layers being alternately stacked. At least one of the potential barrier sub-layers of the first active layer unit has a GaN/Al$_{x1}$In$_{y1}$Ga$_{(1-x1-y1)}$N stack, where 0<x1≤1 and 0≤y1<1. The one of the potential barrier sub-layers having the GaN/Al$_{x1}$In$_{y1}$Ga$_{(1-x1-y1)}$N stack is disposed farthest away from the electron-collecting layer. The one of the potential barrier sub-layers of the first active layer unit farthest away from the electron-collecting layer is undoped, and for the remainder of the potential barrier sub-layers of the first active layer unit, each of the potential barrier sub-layers is one of a n-doped layer and a p-doped layer.

According to a second aspect of the disclosure, an LED device includes a substrate, a buffer layer disposed on the substrate, an N-type cladding layer disposed on the buffer layer, the multi-quantum well structure of the first aspect of the disclosure which is disposed on the N-type cladding layer, a P-type cladding layer disposed on the multi-quantum well structure, and a P-type contact layer disposed on the P-type cladding layer.

BRIEF DESCRIPTION OF THE DRAWINGS

Other features and advantages of the disclosure will become apparent in the following detailed description of the embodiments with reference to the accompanying drawings, in which.

DETAILED DESCRIPTION

Figure 1:
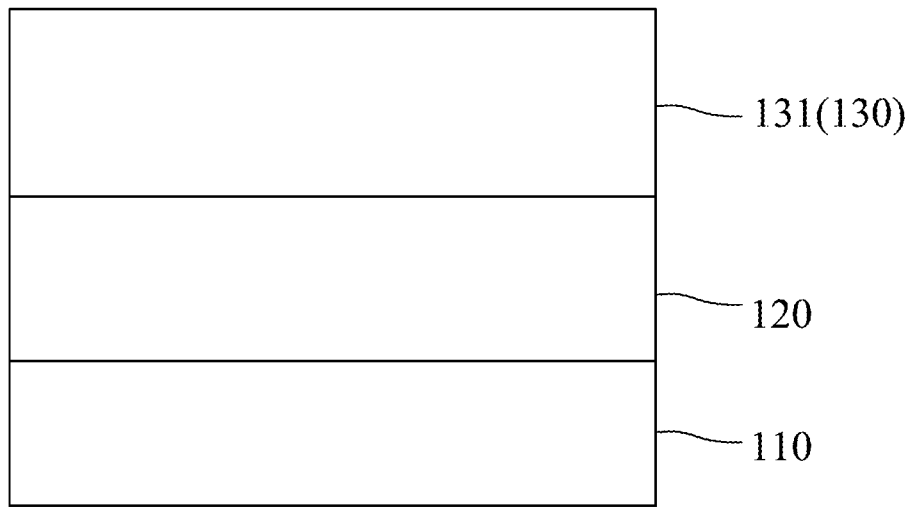
FIG. 1 is a schematic view of a first embodiment of a multi-quantum well structure according to the disclosure.

Hereinafter, the embodiments will be described in detail with reference to the accompanying drawings. It should be noted that the drawings, which are for illustrative purposes only, are not drawn to scale, and are not intended to represent the actual sizes or actual relative sizes of the components of the multi-quantum well structure and the LED device including the same. Moreover, where considered appropriate, reference numerals have been repeated among the figures to indicate corresponding or analogous elements, which may optionally have similar characteristics.

First Embodiment

Referring to FIG. 1, a first embodiment of a multi-quantum well structure 100 according to the disclosure includes a stress relief layer 110, an electron-collecting layer 120 disposed on the stress relief layer 110, and an active layer 130. The active layer 130 includes a first active layer unit 131 that is disposed on the electron-collecting layer 120. The first active layer unit 131 of the active layer 130 includes multiple pairs of sub-layers, the sub-layers in each pair including a potential barrier sub-layer and a potential well sub-layer. The plurality of potential barrier sub-layers and the plurality of potential well sub-layers of the first active layer unit 131 are alternately stacked. At least one of the potential barrier sub-layers of the first active layer unit 131 has a GaN/Al$_{x1}$In$_{y1}$Ga$_{(1-x1-y1)}$N stack, where $0<x1\leq 1$ and $0\leq y1<1$, and for the remainder of the potential barrier sub-layers of the first active layer unit 131, each of the potential barrier sub-layers is a GaN layer. In this embodiment, each of the potential well sub-layers of the first active layer unit 131 is an InGaN layer.

In certain embodiments, in the GaN/Al$_{x1}$In$_{y1}$Ga$_{(1-x1-y1)}$N stack, y1=0 and $0.05\leq x1\leq 1$. That is, said at least one of the potential barrier sub-layers of the first active layer unit 131 has the GaN/Al$_{x1}$Ga$_{(1-x1)}$N stack. In the GaN/Al$_{x1}$Ga$_{(1-x1)}$N stack (i.e., y1=0), the range of x1 may be $0.1\leq x1\leq 1$, $0.05\leq x1\leq 0.20$, or $0.1\leq x1\leq 0.15$.

In certain embodiments, the one of the potential barrier sub-layers having the GaN/Al$_{x1}$In$_{y1}$Ga$_{(1-x1-y1)}$N stack in the first active layer unit 131 is disposed farthest away from the electron-collecting layer 120.

In certain embodiments, in the first active layer unit 131, the one of the potential barrier sub-layers farthest away from the electron-collecting layer 120 is undoped, and for the remainder of the potential barrier sub-layers, each of the potential barrier sub-layers is one of an n-doped layer and a p-doped layer.

In certain embodiments, the one of the potential barrier sub-layers of the first active layer unit 131 farthest away from the electron-collecting layer 120 has a thickness ranging from 140 Å to 190 Å, and has the GaN/Al$_{x1}$Ga$_{(1-x1)}$N stack (i.e., y=0) with $0.05\leq x1\leq 1$. A thickness of Al$_{x1}$Ga$_{(1-x1)}$N in the GaN/Al$_{x1}$Ga$_{(1-x1)}$N stack ranges from 20 Å to 30 Å.

In certain embodiments, the stress relief layer 110 includes less than 30 pairs of sub-layers, the sub-layers in each pair including a potential barrier sub-layer and a potential well sub-layer. The plurality of potential barrier sub-layers and the plurality of potential well sub-layers of the stress relief layer 110 are alternately stacked. Each of the potential barrier sub-layers is a GaN layer, and each of the potential well sub-layers is an InGaN layer. An In amount in the stress relief layer 110 is less than 15% based on a total weight of the stress relief layer 110.

In certain embodiments, the stress relief layer 110 is an InGaN layer, where the In amount in the stress relief layer 110 is less than 15% based on a total weight of the stress relief layer 110.

The electron-collecting layer 120 includes multiple pairs of sub-layers, the sub-layers in each pair including a potential barrier sub-layer and a potential well sub-layer. The plurality of potential barrier sub-layers and the plurality of potential well sub-layers of the electron-collecting layer 120 are alternately stacked. In this embodiment, the electron-collecting layer 120 includes three to six pairs of the sub-layers. One of the potential barrier sub-layers of the electron-collecting layer 120 (e.g., the one farthest away from the stress relief layer 110) has a GaN/Al$_{x2}$Ga$_{(1-x2)}$N/GaN stack, where $0.05\leq x2\leq 1$, and for the remainder of the potential barrier sub-layers of the electron-collecting layer 120, each of the potential barrier sub-layers is a GaN layer. In this embodiment, each of the potential well sub-layers of the electron-collecting layer 120 is an InGaN layer having an In concentration lower than that of the potential well sub-layers of the first active layer unit 131. With the potential barrier sub-layer having the GaN/Al$_{x2}$Ga$_{(1-x2)}$N/GaN stack, the electron mobility is reduced, and electron leakage under a high current density can be alleviated. In addition, the electron-collecting layer 120 having fewer pairs of the sub-layers would have better lattice quality compared to the conventional electron-collecting layer with greater number of the pairs of the sub-layers.

Figure 2:
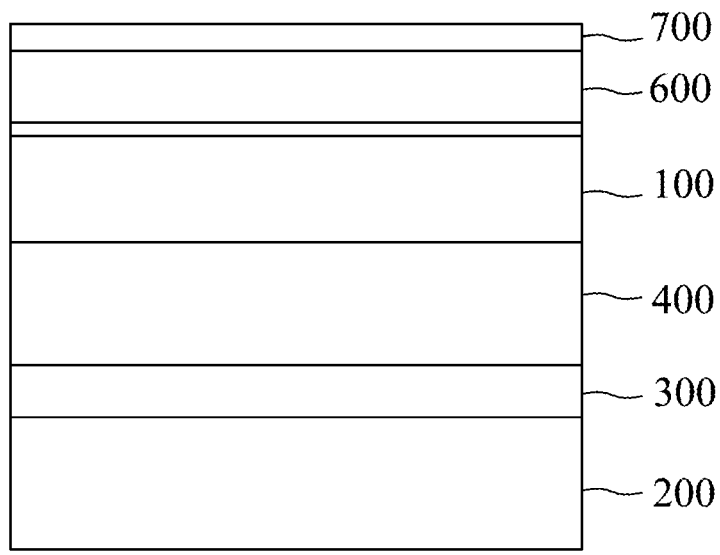
FIG. 2 is a schematic view of a first embodiment of a light-emitting diode (LED) device according to the disclosure.

Referring to FIG. 2, a first embodiment of a light-emitting diode (LED) device according to the disclosure includes a substrate 200, a buffer layer 300 disposed on the substrate 200, an N-type cladding layer 400 disposed on the buffer layer 300, the aforesaid multi-quantum well structure 100 disposed on the N-type cladding layer 400, a P-type cladding layer 600 disposed on the multi-quantum well structure 100, and a P-type contact layer 700 disposed on the P-type cladding layer 600.

The LED device also includes an electron-blocking layer 500 disposed between the multi-quantum well structure 100 and the P-type cladding layer 600. The electron-blocking layer 500 has a Al$_{x3}$In$_{y3}$Ga$_{(1-x3-y3)}$N layer or a Al$_{x3}$In$_{y3}$Ga$_{(1-x3-y3)}$/Al$_{x4}$In$_{y4}$Ga$_{(1-x4-y4)}$N superlattice structure, where $0\leq x3\leq 1$, $0\leq y3\leq 1$, $0\leq x4\leq 1$, $0\leq y4\leq 1$, x3 and x4 cannot both be 1 or 0, y3 and y4 cannot both be 1 or 0, x3 and y3 cannot both be 0, and x4 and y4 cannot both be 0. In this embodiment, the electron-blocking layer 500 has a thickness ranging from 200 Å to 300 Å.

In comparison to a conventional multi-quantum well structure having a GaN potential barrier sub-layer, the potential barrier sub-layer(s) of the electron-collecting layer 120 having the GaN/Al$_{x2}$Ga$_{(1-x2)}$N/GaN stack and the potential barrier sub-layer(s) of the active layer 130 having the GaN/Al$_{x1}$In$_{y1}$Ga$_{(1-x1-y1)}$N stack have higher band gaps. Therefore, the electron-collecting layer 120 and the active layer 130 would cooperate with the electron-blocking layer 500 to scatter and block electrons. In addition, as compared to the conventional electron-blocking layer, the electron-blocking layer 500 of the disclosure has a smaller thickness, e.g., 200 Å to 300 Å, which alleviates the light-blocking effect caused by a greater thickness of the conventional electron-blocking layer and improves the brightness of the LED device.

Further, since the one of the potential barrier sub-layers of the first active layer unit 131 having the GaN/Al$_{x1}$In$_{y1}$Ga$_{(1-x1-y1)}$N stack is disposed farthest away from the electron-collecting layer 120 (i.e., immediately adjacent to the electron-blocking layer 500), the potential barrier sub-layer having the GaN/Al$_{x1}$In$_{y1}$Ga$_{(1-x1-y1)}$N stack may capture electrons leaking from the multi-quantum well structure 100. Moreover, the potential barrier sub-layer having the GaN/Al$_{x1}$In$_{y1}$Ga$_{(1-x1-y1)}$N stack may improve the lattice quality at an interface between the stress relief layer 110 and the electron-collecting layer 120 and an interface between the electron-collecting layer 120 and the active layer 130, and may prevent a dopant of the P-type cladding layer 600 from permeating into the active layer 130 during formation of the P-type cladding layer 600.

Second Embodiment

Figure 3:
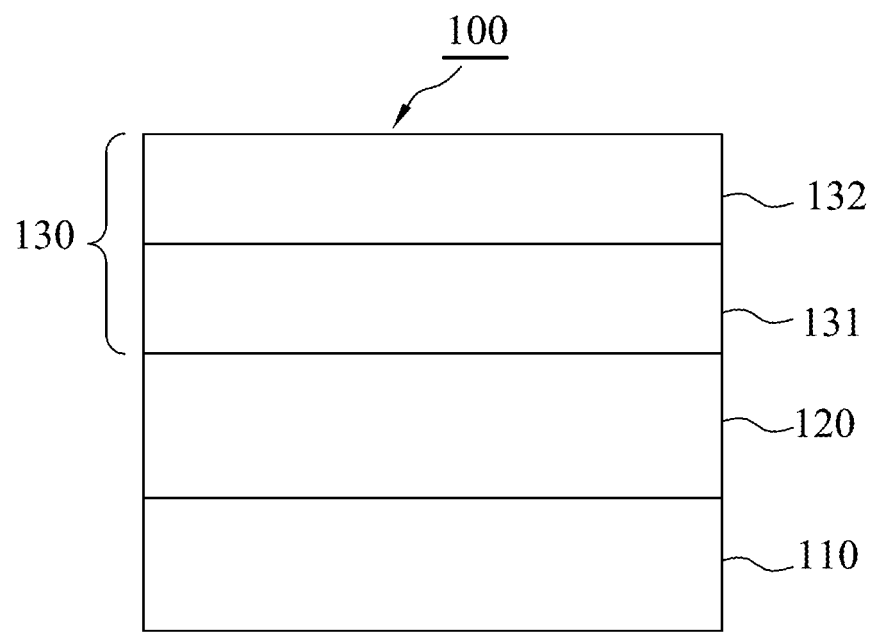
FIG. 3 is a schematic view of a second embodiment of the multi-quantum well structure according to the disclosure.

Referring to FIG. 3, a second embodiment of the multi-quantum well structure 100 according to the disclosure is similar to the first embodiment of the multi-quantum well 100 except that the second embodiment of the multi-quantum well structure 100 further includes a second active layer unit 132 that is disposed on the first active layer unit 131. The second active layer unit 132 includes multiple pairs of sub-layers, the sub-layers in each pair including a potential barrier sub-layer and a potential well sub-layer. The plurality of potential barrier sub-layers and the plurality of potential well sub-layers are alternately stacked. Each of the potential barrier sub-layers of the first active layer unit 131 has a band gap larger than that of each of the potential barrier sub-layers of the second active layer unit 132. In this embodiment, each of the potential barrier sub-layers of the second active layer unit 132 is a GaN layer.

In certain embodiments, each of the potential barrier sub-layers of the first active layer unit 131 has the GaN/$Al_{x1}In_{y1}Ga_{(1-x1-y1)}N$ stack.

In certain embodiments, the first active layer unit 131 includes 4 to 8 pairs of the sub-layers, while the second active layer unit 132 includes 5 to 10 pairs of the sub-layers.

In certain embodiments, in the GaN/$Al_{x1}In_{y1}Ga_{(1-x1-y1)}N$ stack of the first active layer unit 131, y1=0 and $0.02 \leq x1 \leq 0.06$.

In certain embodiments, the first active layer unit 131 is disposed between the second active layer unit 132 and the electron-collecting layer 120.

By forming the first active layer unit 131, electron leakage problem under a high current density may be reduced, and the rate of radiative recombination between electrons and holes and the internal quantum efficiency can be increased, thereby improving the efficiency droop phenomenon. Moreover, the lattice defect in the InGaN potential well sub-layers of the first active layer unit 131 may also be eliminated.

Figure 4:
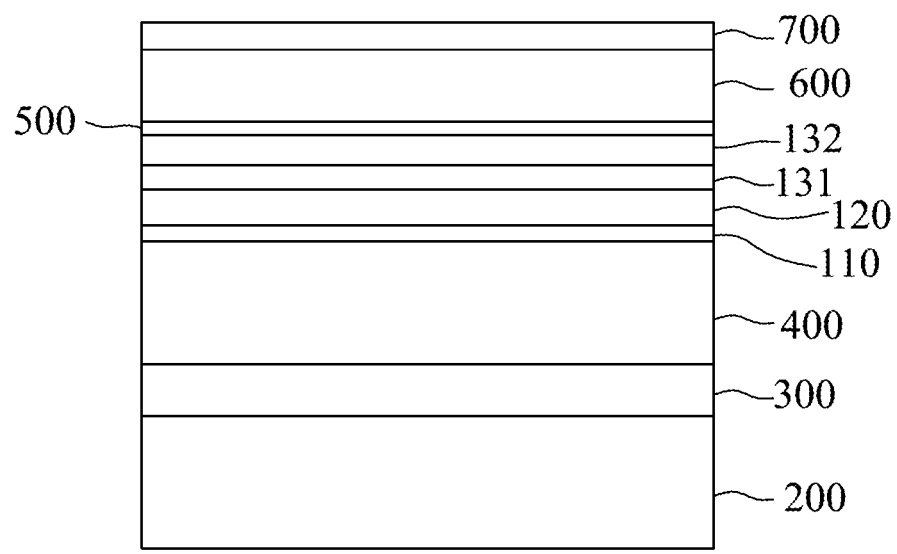
FIG. 4 is a schematic view of a second embodiment of the LED device according to the disclosure.

Referring to FIG. 4, a second embodiment of the LED device is similar to the first embodiment of the LED device except that the second embodiment of the LED device includes the second embodiment of the multi-quantum well structure 100 according to the disclosure. In the second embodiment of the LED device, the first active layer unit 131 has 4 to 8 pairs of the sub-layers, and the second active layer unit 132 has 5 to 10 pairs of the sub-layers. In addition, the electron-blocking layer 500 in the second embodiment of the LED device has a thickness of 250 Å to 300 Å, and has the $Al_{x3}In_{y3}Ga_{(1-x3-y3)}/Al_{x4}In_{y4}Ga_{(1-x4-y4)}N$ superlattice structure, where $0.05 \leq x3 \leq 0.2$, $0 \leq y3 \leq 0.10$, $0.05 \leq x4 \leq 0.2$ and $0 \leq y4 \leq 0.10$.

Third Embodiment

Figure 5:
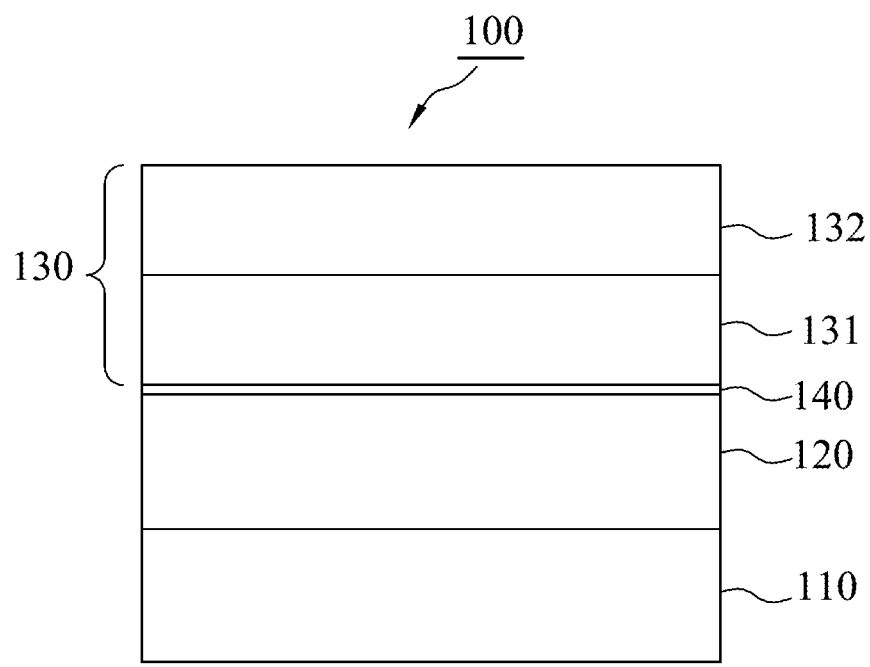
FIG. 5 is a schematic view of a third embodiment of the multi-quantum well structure according to the disclosure.

Referring to FIG. 5, a third embodiment of the multi-quantum well structure 100 according to the disclosure includes a stress relief layer 110, an electron-collecting layer 120 disposed on the stress relief layer 110, an interfacial layer 140 disposed on the electron-collecting layer 120, and an active layer 130 disposed on the interfacial layer 140 oppositely of the electron-collecting layer 120. The active layer 130 includes a first active layer unit 131 that is disposed on the interfacial layer 140, and a second active layer unit 132 that is disposed on the first active layer unit 131 oppositely of the interfacial layer 140.

The first active layer unit 131 of this embodiment has a structure similar to that of the first active layer unit 131 disclosed in the second embodiment, except that, in this embodiment, a number of the pairs of the sub-layers in the first active layer unit 131 ranges from 3 to 5. It should be noted that each of the potential barrier sub-layers of the first active layer unit 131 may have the GaN/$Al_{x1}In_{y1}Ga_{(1-x1-y1)}N$ stack. In certain embodiments, in the GaN/$Al_{x1}In_{y1}Ga_{(1-x1-y1)}N$ stack of the first active layer unit 131, y1=0 and $0.02 \leq x1 \leq 0.06$.

The second active layer unit 132 of this embodiment includes multiple pairs of sub-layers, the sub-layers in each pair including a potential barrier sub-layer and a potential well sub-layer. The plurality of potential barrier sub-layers and the plurality of potential well sub-layers are alternately stacked. Each of the potential barrier sub-layers of the first active layer unit 131 has a band gap larger than that of each of the potential barrier sub-layers of the second active layer unit 132. In this embodiment, one of the potential barrier sub-layers of the second active layer unit 132 (e.g., the one disposed farthest away from the first active layer unit 131) has a GaN/$Al_{x1}Ga_{(1-x1)}N$/GaN stack ($0.1 \leq x1 \leq 1$), and has a thickness ranging from 80 Å to 120 Å, and a thickness of $Al_{x1}Ga_{(1-x1)}N$ in the GaN/$Al_{x1}Ga_{(1-x1)}N$/GaN stack ranges from 20 Å to 30 Å. For the remainder of the potential barrier sub-layers of the second active layer unit 132, each of the potential barrier sub-layers is a GaN layer. Each of the potential well sub-layers of the second active layer unit 132 is an InGaN layer. In this embodiment, a number of the pairs of the sub-layers in the second active layer unit 131 ranges from 3 to 5.

The electron-collecting layer 120 in this embodiment has the same structure as the electron-collecting layer 120 disclosed in the first embodiment. The interfacial layer 140 disposed between the electron-collecting layer 120 and the active layer 130 has a band gap smaller than that of each of the potential well sub-layers of the active layer 130. The interfacial layer 140 may confine movement of the electrons and can reduce electron mobility. In certain embodiments, the interfacial layer 140 is an InN layer. In addition, the interfacial layer 140 may alleviate lattice difference between the active layer 130 and the one of the potential barrier sub-layers of the electron-collecting layer 120 farthest away from the stress relief layer 110.

Figure 6:
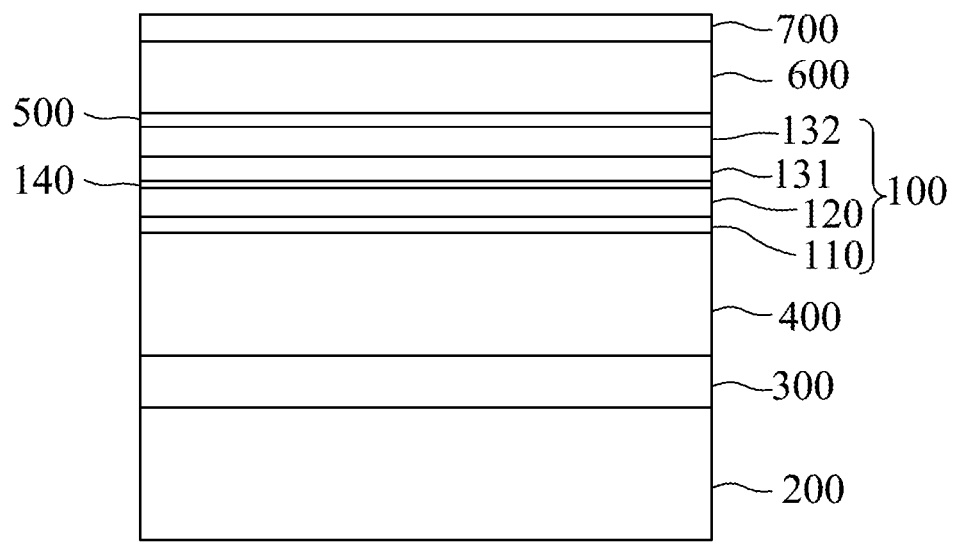
FIG. 6 is a schematic view of a third embodiment of the LED device according to the disclosure.

Referring to FIG. 6, a third embodiment of the LED device according to the disclosure is similar to the second embodiment of the LED device except that the third embodiment of the LED device includes the third embodiment of the multi-quantum well structure 100 and that the electron-blocking layer 500 is a $Al_{x3}In_{y3}Ga_{(1-x3-y3)}N$ layer, where $0.05 \leq x3 \leq 0.2$, $0 \leq y3 \leq 0.1$, and has a thickness ranging from 220 Å to 280 Å.

In sum, with the GaN/$Al_{x1}In_{y1}Ga_{(1-x1-y1)}N$ stack of the first active layer unit, the GaN/$Al_{x1}Ga_{(1-x1)}N$/GaN stack of the second active layer unit, and the GaN/$Al_{x2}Ga_{(1-x2)}N$/GaN stack of the electron-collecting layer, each having a band gap larger than that of GaN, the multi-quantum well structure 100 of the disclosure exhibits improved electron-blocking effect, and alleviates the electron leakage and efficiency droop phenomena. Moreover, the thickness of the electron-blocking layer 500 may be reduced so as to enhance the light-emitting efficiency of the LED device.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A multi-quantum well structure comprising:
    a stress relief layer;
    an electron-collecting layer disposed on said stress relief layer; and
    an active layer including a first active layer unit that is disposed on said electron-collecting layer and that includes a plurality of potential barrier sub-layers and a plurality of potential well sub-layers being alternately stacked;
    wherein
    at least one of said potential barrier sub-layers of said first active layer unit has a GaN/Al$_{x1}$In$_{y1}$Ga$_{(1-x1-y1)}$N stack, where 0<x1≤1 and 0≤y1<1,
    said one of said potential barrier sub-layers having said GaN/Al$_{x1}$In$_{y1}$Ga$_{(1-x1-y1)}$N stack is disposed farthest away from said electron-collecting layer, and
    said one of said potential barrier sub-layers of said first active layer unit farthest away from said electron-collecting layer is undoped, and for the remainder of said potential barrier sub-layers of said first active layer unit, each of said potential barrier sub-layers is one of a n-doped layer and a p-doped layer.

2. The multi-quantum well structure as claimed in claim 1, wherein in said GaN/Al$_{x1}$In$_{y1}$Ga$_{(1-x1-y1)}$N stack, y1=0 and 0.05≤x1≤1.

3. The multi-quantum well structure as claimed in claim 1, wherein said one of said potential barrier sub-layers of said first active layer unit farthest away from said electron-collecting layer has a thickness ranging from 140 Å to 190 Å, and thickness of Al$_{x1}$In$_{y1}$Ga$_{(1-x1-y1)}$N in the GaN/Al$_{x1}$In$_{y1}$Ga$_{(1-x1-y1)}$N stack ranges from 20 Å to 30 Å.

4. The multi-quantum well structure as claimed in claim 1, wherein:
    said active layer further includes a second active layer unit that is disposed on said first active layer unit and that includes a plurality of potential barrier sub-layers and a plurality of potential well sub-layers being alternately stacked; and
    each of said potential barrier sub-layers of said first active layer unit has a band gap larger than that of each of said potential barrier sub-layers of said second active layer unit.

5. The multi-quantum well structure as claimed in claim 4, wherein each of said potential barrier sub-layers of said second active layer unit is a GaN layer.

6. The multi-quantum well structure as claimed in claim 5, wherein in said GaN/Al$_{x1}$In$_{y1}$Ga$_{(1-x1-y1)}$N stack, y1=0 and 0.02≤x1≤0.06.

7. The multi-quantum well structure as claimed in claim 4 wherein said first active layer unit is disposed between said second active layer unit and said electron-collecting layer.

8. The multi-quantum well structure as claimed in claim 4, wherein at least one of said potential barrier sub-layers of said second active layer unit has a GaN/Al$_{x1}$Ga$_{(1-x1)}$N/GaN stack, where 0<x1≤1, and for the remainder of said potential barrier sub-layers of said second active layer unit, each of said potential barrier sub-layers is a GaN layer.

9. The multi-quantum well structure as claimed in claim 1, further comprising an interfacial layer that is disposed between said electron-collecting layer and said active layer and that has a band gap smaller than that of each of said potential well sub-layers of said first active layer unit.

10. The multi-quantum well structure as claimed in claim 1, wherein:
    said electron-collecting layer includes a plurality of potential barrier sub-layers and plurality of potential well sub-layers that are alternately stacked;
    one of said potential barrier sub-layers of said electron-collecting layer farthest away from said stress relief layer has a GaN/Al$_{x2}$Ga$_{(1-x2)}$N/GaN stack, where 0≤x2≤1, and for the remainder of said potential barrier sub-layers of said electron-collecting layer, each of said potential barrier sub-layers is a GaN layer; and
    each of said potential well sub-layers of said electron-collecting layer is a InGaN layer.

11. An LED device comprising:
    a substrate;
    a buffer layer disposed on said substrate;
    a N-type cladding layer disposed on said buffer layer;
    a multi-quantum well structure as claimed in claim 1, which is disposed on said N-type layer;
    a P-type cladding layer disposed on said multi-quantum well structure; and
    a P-type contact layer disposed on said P-type layer.

12. The LED device as claimed in claim 11, further comprising an electron-blocking layer disposed between said multi-quantum well structure and said P-type cladding layer.

13. The LED device as claimed in claim 12, wherein said electron-blocking layer has a thickness ranging from 200 Å to 300 Å.

14. The LED device as claimed in claim 12, wherein said electron-blocking layer has one of a Al$_{x3}$In$_{y3}$Ga$_{(1-x3-y3)}$N layer and a Al$_{x3}$In$_{y3}$Ga$_{(1-x3-y3)}$/Al$_{x4}$In$_{y4}$Ga$_{(1-x4-y4)}$N superlattice layer, where 0≤x3≤1, 0≤y3≤1, 0≤x4≤1 and 0≤y4≤1, x3 and x4 cannot both be 1 or 0, y3 and y4 cannot both be 1 or 0, x3 and y3 cannot both be 0, and x4 and y4 cannot both be 0.

15. The LED device as claimed in claim 11, wherein:
    said active layer further includes a second active layer unit that is disposed on said first active layer unit and that includes a plurality of potential barrier sub-layers and a plurality of potential well sub-layers being alternately stacked; and
    each of said potential barrier sub-layers of said first active layer unit has a band gap larger than that of each of said potential barrier sub-layers of said second active layer unit.

16. The LED device as claimed in claim 15, wherein each of said potential barrier sub-layers of said second active layer unit is a GaN layer.

17. The LED device as claimed in claim 15, wherein at least one of said potential barrier sub-layers of said second active layer unit has a GaN/Al$_{x1}$Ga$_{(1-x1)}$N/GaN stack, where 0<x1≤1, and for the remainder of said potential barrier sub-layers of said second active layer unit, each of said potential barrier sub-layers is a GaN layer.

18. The LED device as claimed in claim 11, wherein:
    said electron-collecting layer includes a plurality of potential barrier sub-layers and a plurality of potential well sub-layers that are alternately stacked;
    one of said potential barrier sub-layers of said electron-collecting layer farthest away from said stress relief layer has a GaN/Al$_{x2}$Ga$_{(1-x2)}$N/GaN stack, where 0≤x2≤1, and for the remainder of said potential barrier sub-layers of said electron-collecting layer, each of said potential barrier sub-layers is a GaN layer; and each of said potential well sub-layers of said electron-collecting layer is an InGaN layer.

\* \* \* \* \*